United States Patent
Riedl

(10) Patent No.: US 6,727,587 B2
(45) Date of Patent: Apr. 27, 2004

(54) CONNECTION DEVICE AND METHOD FOR PRODUCING THE SAME

(75) Inventor: Edmund Riedl, Obertraubling (DE)

(73) Assignee: Infineon Technologies AG, Munich (DE)

( * ) Notice: Subject to any disclaimer, the term of this patent is extended or adjusted under 35 U.S.C. 154(b) by 95 days.

(21) Appl. No.: 10/135,473

(22) Filed: Apr. 30, 2002

(65) Prior Publication Data

US 2003/0201532 A1 Oct. 30, 2003

(51) Int. Cl.[7] .................. H01L 23/52; H01L 23/48; H01L 29/40
(52) U.S. Cl. .................. 257/748; 257/690; 257/741; 257/751; 257/761; 257/762; 257/772
(58) Field of Search ................. 257/677, 700, 257/690, 698, 741, 747, 748, 751, 761, 762, 772

(56) References Cited

U.S. PATENT DOCUMENTS

| | | | | |
|---|---|---|---|---|
| 5,489,803 A | * | 2/1996 | Kanbe et al. ......... | 257/767 |
| 6,110,608 A | * | 8/2000 | Tanimoto et al. ...... | 428/647 |
| 6,278,180 B1 | * | 8/2001 | Mizushima et al. ..... | 257/700 |
| 6,515,372 B1 | * | 2/2003 | Narizuka et al. ...... | 257/779 |
| 6,635,957 B2 | * | 10/2003 | Kwan et al. .......... | 257/691 |
| 2001/0027007 A1 | * | 10/2001 | Hosomi et al. ........ | 438/611 |

* cited by examiner

*Primary Examiner*—Nathan J. Flynn
*Assistant Examiner*—Victor A. Mandala, Jr.
(74) *Attorney, Agent, or Firm*—Laurence A. Greenberg; Werner H. Stemer; Ralph E. Locher

(57) ABSTRACT

A connection device for a circuitry device connects a circuitry unit with a contact device to thermo-mechanically uncouple the circuitry unit and the contact device by forming the connection device as a metallic section and/or an alloy section having a buffer region, an intermediate region, and a connection region. The buffer region is of silver, the intermediate region (14) is of a silver-tin alloy region, and the connection region (16) is of an intermetallic substrate and, in particular, of an intermetallic tin-substrate.

39 Claims, 2 Drawing Sheets

CONNECTION DEVICE AND METHOD FOR PRODUCING THE SAME

BACKGROUND OF THE INVENTION

Field of the Invention

The present invention relates to a connection device and, more particularly, to a connection device in or for a circuitry device, for instance, in or for a semiconductor module or the like. Further, the present invention relates to a method for producing such a connection device.

When constructing or constituting circuitry configurations, it is often necessary to combine different materials with each other to ensure a mechanical and/or electrical contact. In particular, this is true in the field of contacting circuitry units, for instance, chips or the like, with respective contact devices. Because of the different thermo-mechanical properties, which are primarily based on different heat expansion coefficients, in use and operation of such circuitry units and electronic elements or the like mechanical stresses and tensions between different components thereof may occur.

These effects regarding mechanical stresses between different components are of major disadvantage with respect to the lifetime of the different electronic components.

SUMMARY OF THE INVENTION

It is accordingly an object of the invention to provide a connection device and method for producing the same that overcomes the hereinafore-mentioned disadvantages of the heretofore-known devices and methods of this general type and that is capable of compensating thermo-mechanical stresses and/or tensions at interfaces between a circuitry unit and a contact device in a particular easy and reliable manner involving only a small amount of surface areas.

With the foregoing and other objects in view, there is provided, in accordance with the invention, a connection device for at least one of mechanically and electrically connecting at least one circuitry unit of a circuitry device with at least one contact device and to thereby thermo-mechanically uncouple the circuitry unit and the contact device, the connection device including a preformed section of at least one of the group consisting of a metallic section and an alloy section, the preformed section having a buffer region including silver, an intermediate region including a silver-tin alloy, and a connection region including an intermetallic substrate of at least one of tin, silver, a metal able to form an intermetallic compound with at least one of tin and silver, and a metal material able to form an intermetallic compound with at least one of tin and silver, and the preformed section disposed at one of the group consisting of the circuitry unit and the contact device.

The connection device of the invention in or for a circuitry device is, in particular, configured to be contained in or applied for a semiconductor module or the like. The connection device is adapted to mechanically and/or electrically connect at least one circuitry unit of the circuitry device with at least one contact device and to thereby thermo-mechanically uncouple the circuitry unit and the contact device. The circuitry unit may be built up as a chip or the like. The connection device is substantially formed as a metallic section and/or as an alloy section at least in part of a region of the circuitry unit and/or at least in part of a region of the contact device. The contact device may be built up as a preformed metallic section and/or alloy section. According to the invention, the connection device has a buffer region, an intermediate region, and a connection region. The buffer region contains or is formed of silver, the intermediate region contains or is formed of a silver-tin alloy region, and the connection region has or is formed as an intermetallic substrate of tin and/or silver with at least one further metal and/or metal like material, the further metal and/or metal like material being capable of forming an intermetallic compound with tin and/or silver.

It is, therefore, a basic aspect of the present invention to build up the connecting device with three regions, the first region being a buffer region of silver and, therefore, being capable of absorbing thermo-mechanical stresses between its surrounding. Furthermore, the present invention provides an intermediate region containing or being formed of a silver-tin alloy region and a connection region having or being formed as an intermetallic substrate, wherein the intermetallic substrate is made of tin and/or silver with at least one further metal and/or metal like material, the further metal and/or metal like material being capable of forming an intermetallic compound with tin and/or silver.

In accordance with another feature of the invention, the at least one further metal or metal like material is one metal or metal like material from the group including Cu, Ag, Ni, NiP, Au, NiPd, Fe, Pd, Pt, Ti, V, or the like.

In accordance with a further feature of the invention, the intermetallic substrate is an intermetallic tin-substrate.

The buffer region may be formed as at least one layer or film; a plurality of layers or films is also possible.

In accordance with an added feature of the invention, the buffer region is formed with at least one surface portion thereof as an integral part of the structure of the circuitry unit. This particular measure ensures a particularly reliable mechanical and electrical contact between the connection device and the circuitry unit to be connected thereto.

Alternatively or additionally, in accordance with an additional feature of the invention, the connection region may also be formed as at least one layer or film; also, in this case, a plurality of layers of films is possible.

In accordance with yet another feature of the invention, it is preferred to form the connection region at least with one surface portion thereof as an integral part of the connection device and/or of the circuitry. With such a measure, a particular reliable connection between the connection device and the contact device and/or the circuitry unit is possible and ensured.

In accordance with yet a further feature of the invention, the connection region for mechanically and/or electrically connecting the connection device with the contact device is preferably formed as a tin-alloy region with at least one metal component of the contact device. For instance, copper is employed at least as a part of the contact device, then the tin-alloy region may include or may be formed as a region of $Cu_6Sn_5$ ($\epsilon$) or the like.

To better ensure the compensation of thermo-mechanical stresses between the contact device and the circuitry unit, in accordance with yet an added feature of the invention, the intermediate region preferably contains a sequence of a plurality of layers or films.

In accordance with yet an additional feature of the invention, the sequence of layers or films includes a first layer containing or being formed of Ag(Sn), a second layer containing or being formed of $Ag_5Sn(\zeta)$, and a third or last layer containing or being formed of $Ag_3Sn(\epsilon)$.

In accordance with again another feature of the invention, it is of further advantage if the first layer of the intermediate region is in contact and/or at least in part integral with the buffer region.

Further, preferably, the third layer or last layer of the intermediate region is in contact and/or at least partially integral with the contact region.

With the objects of the invention in view, there is also provided a method for producing a circuitry connection device including the steps of at least one of mechanically and electrically connecting at least one circuitry unit of a circuitry device with at least one contact device to thermo-mechanically uncouple the circuitry unit and the contact device by providing a metal/alloy portion between respective predetermined surface portions of the circuitry unit and the contact device, the metal/alloy portion having a first section including silver and facing the surface portion of the circuitry unit, a second section including a silver-tin alloy and facing the surface portion of the contact device, and the first and second sections facing each other, heating at least one of the metal/alloy portion and at least parts of the first and second surface portions above a eutectic melting temperature of the silver-tin alloy to form a buffer region including silver, an intermediate region with a silver-tin alloy region, and a connecting region at the contact device including an intermetallic substrate of at least one of tin, silver, a metal able to form an intermetallic compound with at least one of tin and silver, and a metal material able to form an intermetallic compound with at least one of tin and silver.

There is also provided a method for producing the inventive connection device, the connection device being provided in or for a circuitry device, in particular, in or for a semiconductor module or the like to mechanically and/or electrically connect at least one circuitry unit, in particular, a chip or the like, of the circuitry device with at least one contact device and thereby to a thermo-mechanically uncouple the circuitry unit and a the contact device.

The method includes a step of providing, between predetermined surface portions of the circuitry unit and the contact device, respectively, a metal-alloy portion having a first section being formed of or containing silver (Ag) and facing the surface portion of the circuitry unit and having a second section being formed of or containing a silver-tin alloy (AgSn) and facing the surface portion of the contact device with the first and second sections facing each other.

The method further includes a step of heating the metal/alloy portion and and/or at least parts of the first and second surface portions slightly above an eutectic melting temperature of the silver-tin alloy (AgSn). Thereby, a buffer region containing or being formed of silver (Ag), an intermediate region containing or being formed of a silver-tin alloy region, and a connecting region having or being formed as an intermetallic substrate are formed, wherein the intermetallic substrate is formed of tin and/or silver with at least one further metal and/or metal like material being contained in the contact device, wherein the further metal and/or metal like material is capable of forming an intermetallic compound with tin and/or silver.

It is preferred that the at least one further metal and/or metal like material is chosen to belong to the group including Cu, Ag, Ni, NiP, Au, NiPd, Fe, Pd, Pt, Ti, V, or the like.

It is preferred that the intermetallic substrate is formed as an intermetallic tin-substrate.

In accordance with again a further mode of the invention, a metal/alloy portion is used that contains an excessive amount of silver, in particular, in the second section thereof containing the silver-tin alloy (AgSn).

To realize the excess of silver over the amount of tin, in accordance with again an additional mode of the invention, a metal/alloy portion is used having a first section of a thickness of about 5–20 μm. Alternatively and/or additionally a metal/alloy portion is used having a second section of a thickness of about 1 to 10 μm, preferably, between 2 and 10 μm.

According to a preferred embodiment of the method, the process or step of heating is performed by a step or process of soldering.

These and further aspects of the invention are described in the text that follows.

The present invention relates to metallizations of silver and tin-silver for high-melting diffusion-soldering interconnections with simultaneous stress compensation through Ag buffer material.

Metallizations of a soft Ag-layer and a layer of Sn-xAg (x=1, . . . , 50 wt %) can be used as interconnections to metals that form high-melting intermetallic phases with Sn, e.g. Ag, Cu, Ni. This leads to a highly reliable interconnect with high melting-temperature. The disadvantage of these intermetallic phases is their brittleness, which leads to a crack-fatigue behavior, especially at the interface to a material with a high difference of the thermal expansion coefficient (CTE; e.g. Silicon, CTE=2, $5*10^{-6}K^{-1}$). To compensate stress and tension coming from such CTE-mismatch, a soft and ductile layer of Ag between the intermetallic phase layer and the silicon is applied. The Ag-layer, therefore, is acting in two functions at one time. It is the reactant to Sn forming the intermetallic layer from one side and secondly unreacted Ag remaining soft acts as a buffer in the interconnect.

A first problem to be solved by the present invention is to provide a reliable connection between materials with strong differences with respect to their heat expansion coefficients. This is done by providing a thermo-mechanical tension reduction at the interface by using a metallic buffer, preferably of a thickness of 1–20 μm and/or preferably by using silver Ag and/or cupper Cu.

A second characteristic of the present invention is to provide a connection by forming a high-melting and mechanical reliable metallic connection with a melting point $T_{melt}>300°$ C. The temperature during the performance of the method for producing the connection device is about 250° C., whereas, in contrast, the thermal reliability is above of T=400° C.

In the prior art, soft-soldering with high inductabilities, for instance, with lead-tin alloys with a lead content 90 wt %, have a thermal reliability strictly below 300° C. For connections above such a temperature, no reliable methods and material combinations exist. Stress and tension compensation between parts to be connected and being related to strongly different heat expansion co-efficiency is then achieved by producing structures with a minimal thickness. Additionally, providing such a connection leads to a restriction of the application temperatures because such an application temperature has to be below the melting temperature of the material used within the soft-soldering connection.

For generating crystalline metallic connections below the temperature of 400° C., a process of soldering is usually used. The applicable soldering alloys that can be used below such a temperature have a melting temperature below 300° C., which leads to a restriction to the application temperatures of the connection.

To get rid of such a limitation, the present invention provides the high melting intermetallic phase. It is of particular advantage to use the system of silver-tin Ag—Sn that shows, in its phase diagram, a plurality of high melting intermetallic phases. Above an eutectic melting temperature of about 221° C. an ε-phase is formed at the interface of the metal pair: $Ag_3Sn$ with $T_{melt}$=480 εC. After a certain tempering process a ζ-phase is formed: $Ag_5Sn$ with $T_{melt}$=480–724°C. Directly at the interface between the alloy and the pure silver Ag, a mixing crystal of Ag is formed having a tin content of up to 10 wt % solved therein, for instance, at 200° C.

According to the inventive method for producing one has the following conversion or reaction scheme:

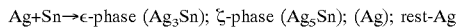

Ag+Sn→ε-phase ($Ag_3Sn$); ζ-phase ($Ag_5Sn$); (Ag); rest-Ag

Based on respective thicknesses of the metal and alloy layers, for instance, Ag 5–20 μm and SnAg 2–10 μm, and an appropriate performance scheme of the process during the soldering, the ratio between silver Ag and molten tin Sn at the beginning of the production of the connection can be made very high, at least 3:1, which corresponds to $Ag_3Sn$. Thereby, silver Ag consumes the complete amount of tin Sn. After a certain time only the above-mentioned intermetallic phases with their high melting temperatures exist.

For accelerating the growing of the phases for Sn-x wt % silver Ag, with 1 wt %<x<50 wt %, is used as a soldering metallization. As at the beginning of forming the connection device, silver Ag is already homogeneously distributed in the melting, and forming of the phases is strongly accelerated.

A further important advantage of involving a silver-tin alloy is the better wetability with respect to a large variety of substrates, for instance, Cu, Ni, NiP, Ag, Au, NiPd, or the like, compared to pure tin Sn. To end up with an appropriate wetability of the metal surface, the natural oxide barrier has to be circumvented, which is done by dissolving the oxide layer in the silver-tin melting. In particular, silver-melting has a high degree of solvability with respect to oxygen, in particular, above 1.5 at %. The content of silver in the tin-silver alloy increases the solvability with respect to oxygen in the melting, leading to a faster dissolving process of the oxide barrier and finally to a better wetability of the metal surface.

As substrates, any metal is appropriate that can be conventionally soldered with tin. The forming of phases on the substrate does not have to be necessarily high to ensure growing of high melting phases because the reaction partner silver Ag is already contained in the metallization where it simultaneously functions as a buffer and where it is sufficient with respect to its content to consume tin Sn completely.

Due to the applied amount of silver Ag, after completion of the reaction, a layer of silver Ag remains that did not participate in reaction. This soft and ductile silver Ag acts as a buffer layer between the substrate and the soldering material and it compensates mechanical tensions and stresses during changing thermal impacts.

Employing the silver buffer in direct spatial relationship to a tin-alloy layer ensures a combination of an alloy connection layer with improved mechanical properties and, simultaneously, a buffer layer for stress or tension compensation. Both capabilities are ensured by the metal.

The present invention provides advantages as described in the following text.

Employing a silver-tin alloy as a diffusion soldering component leads to a better wetability of metallic substrates based on the silver content. Thereby, an easier forming of a connection and a higher mechanical stability is ensured.

According to the buffer capabilities of the remaining silver layer after the reaction, stress or tension compensation capability is ensured at the connection with respect to changing thermal impacts. The thickness ensures the stress or tension compensation as well as the generation of the alloy at the process of connecting the different parts.

The buffer capabilities of silver are better than that of the conventionally used aluminum Al because silver Ag does not, in contrast to aluminum Al, tend to show a cold forming durability. Therefore, the mechanical properties during changing thermal impacts do not change when silver is employed. Additionally, the heat expansion coefficient of silver Ag is about 15% lower than aluminum Al. Further, silver Ag is more stable than aluminum Al with respect to oxidation processes.

In current conveying connections employing a silver buffer, the electrical and the thermal conductivity are increased by about a factor 2 as compared to aluminum Al.

Applying the respective layers can be performed by a galvanic process, which is impossible if aluminum Al is used. With a galvanic process a reduction of costs can be achieved.

Using the invention leads to a higher melting temperature compared to prior art soldering interconnections. Therefore, a higher thermal stability and reliability is possible, in particular, with a higher stability temperature above the working temperature.

Additionally, no addition of lead Pb is necessary, which leads to a more harmless production process as the poison content of lead Pb is avoided.

Other features that are considered as characteristic for the invention are set forth in the appended claims.

Although the invention is illustrated and described herein as embodied in a connection device and method for producing the same, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
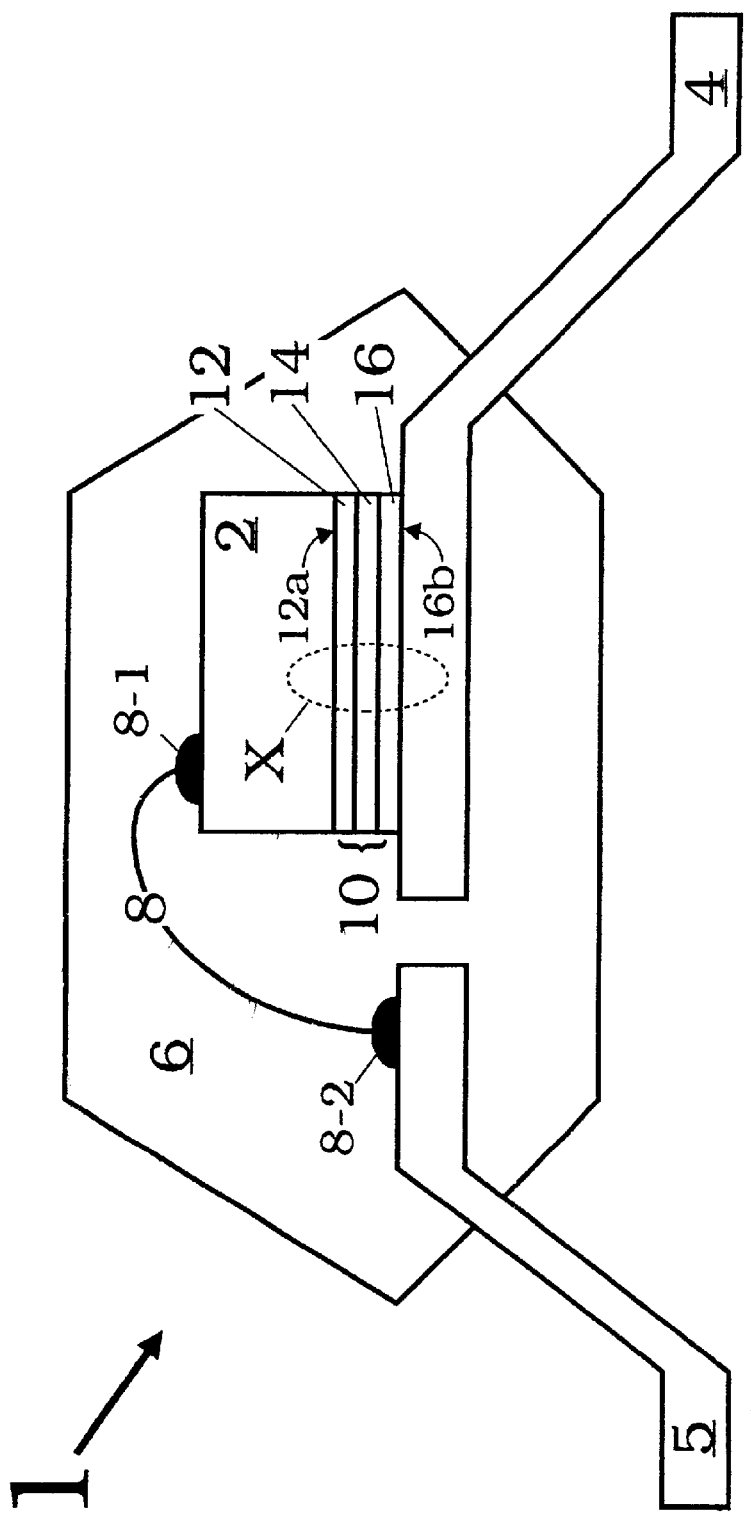
FIG. 1 is a diagrammatic cross-sectional view of a semiconductor module employing an embodiment of the connection device according to the invention.

Referring now to the figures of the drawings in detail and first, particularly to FIG. 1 thereof, there is shown a circuitry configuration 1 having a housing 6 surrounding a circuitry unit 2 connected through a layered connection device 10 according to the invention with a lead frame 4 as a contact device 4 for a mechanical and/or electrical connection. The upper surface of the circuitry unit 2 or the chip 2 is connected to a further contact device 5 employing a bonding wire 8 having first and second contact points 8-1 and 8-2. The housing 6 surrounds the contact devices 4 and 5 together with the circuitry unit 2 and the connection device 10.

Details X of the connection device 10 and its neighborhood are emphasized in FIG. 1 by a dashed circle labeled with an "X", and are explained in further detail with reference to FIGS. 2A and 2B, emphasizing the structure of the inventive connection device 10 including a buffer region 12 or buffer layer 12, an intermediate region 14 or intermediate layer 14, as well as a connection region 16 or connection layer 16.

Figure 2B:
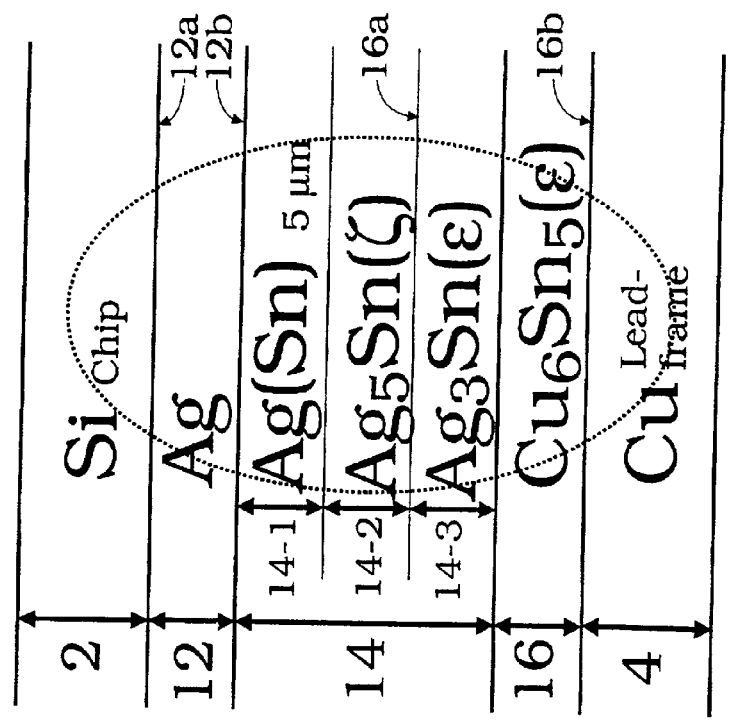
FIG. 2B is a diagrammatic, fragmentary, cross-sectional view of a subsequent production stage of the method of FIG. 2A.
Figure 2A:
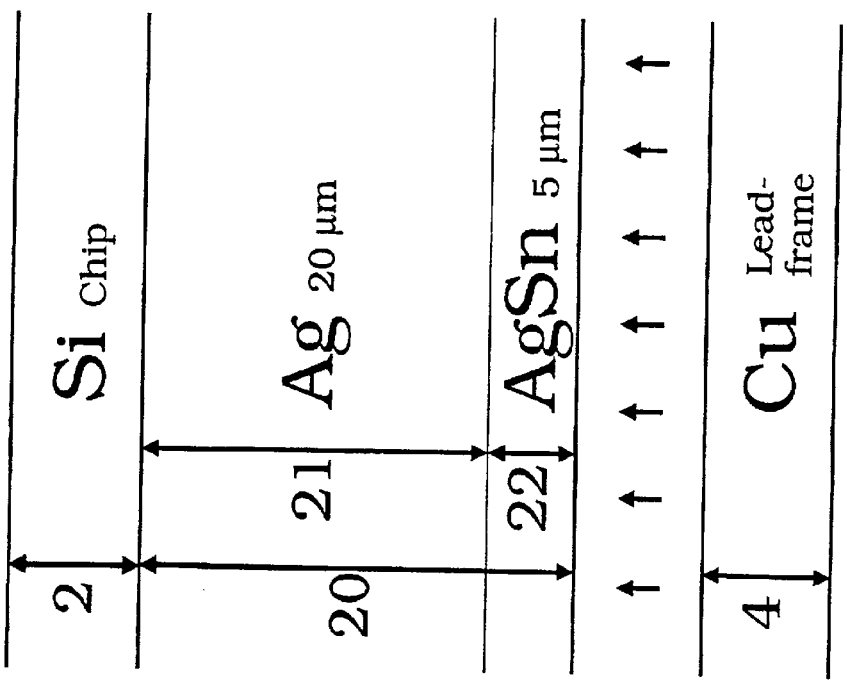
FIG. 2A is a diagrammatic, fragmentary, cross-sectional view of a production stage of the method for producing the connection device according to the invention.

FIG. 2A shows a cross-sectional view of a pre-forming step of the inventive connection device 10. A metal/alloy section 20 is connected to a circuitry unit 2, built up by a silicon chip. The metal/alloy section 20 has a first section 21 in direct connection to the circuitry unit 2 and a second section 22 positioned in connection with the first section 21 of the metal/alloy section 20 and facing away from the circuitry unit 2. The first section 21 of the metal/alloy section 20 is a silver layer of a thickness of about 20 μm. The second section is a silver-tin alloy layer of a thickness of about 5 μm.

Spatially separated from such a configuration is a lead frame 4 as a connection device 4. The sandwich-like structure of the circuitry unit 2 and the attached metal/alloy section 20 are connected to the connection device 4.

After performing the steps for producing the inventive connection device 4, the embodiment illustrated in the cross-sectional view of FIG. 2B results.

Melting and cooling down the metal/alloy section 20 by simultaneously bringing into mechanical contact the lead frame 4 or a contact device 4 with the second section 22 of the metal/alloy section 20 leads to the generation of the silver buffer layer 12 and an intermediate layer 14, as well as a connection layer 16.

According to the present invention, the intermediate region 16 includes three different alloy phases between silver and tin, namely, a first layer 14-1 formed of Ag(Sn), a second layer 14-2 formed of $Ag_5Sn(\zeta)$, and a third layer 14-3 formed of $Ag_3Sn(\epsilon)$ in the order listed in a direction from the buffer region 12 towards the connection region 16. Finally, between the third layer 14-3 and the connection device 4, there is provided a connecting region 16 formed of $Cu_6Sn_5(\epsilon)$.

I claim:

1. A connection device for at least one of mechanically and electrically connecting at least one circuitry unit of a circuitry device with at least one contact device and to thereby thermo-mechanically uncouple the circuitry unit and the contact device, the connection device comprising:
   a preformed section of at least one of the group consisting of a metallic section and an alloy section, said preformed section having:
      a buffer region including silver;
      an intermediate region including a silver-tin alloy; and
      a connection region including an intermetallic substrate of at least one of:
         tin;
         silver;
         a metal able to form an intermetallic compound with at least one of tin and silver; and
         a metal material able to form an intermetallic compound with at least one of tin and silver; and
   said preformed section disposed at one of the group consisting of the circuitry unit and the contact device.

2. The connection device according to claim 1, wherein said metal is selected from the group consisting of Cu, Ag, Ni, NiP, Au, NiPd, Fe, Pd, Pt, Ti, and V.

3. The connection device according to claim 1, wherein said metal material is selected from the group consisting of Cu, Ag, Ni, NiP, Au, NiPd, Fe, Pd, Pt, Ti, and V.

4. The connection device according to claim 1, wherein said intermetallic substrate is an intermetallic tin-substrate.

5. The connection device according to claim 1, wherein said buffer region is at least one layer.

6. The connection device according to claim 1, wherein said buffer region is at least one film.

7. The connection device according to claim 1, wherein said buffer region has at least one surface portion integral with the circuitry unit.

8. The connection device according to claim 1, wherein said connection region is at least one layer.

9. The connection device according to claim 1, wherein said connection region is at least one film.

10. The connection device according to claim 1, wherein said connection region has at least with one surface portion integral with one of the contact device and the circuitry unit.

11. The connection device according to claim 1, wherein:
   the contact device has at least one metal component; and
   said connection region is a tin-alloy region having the at least one metal component.

12. The connection device according to claim 11, wherein the at least one metal component is selected from the group consisting of copper and $Cu_6Sn_5$ ($\epsilon$).

13. The connection device according to claim 1, wherein said intermediate region has a sequence of layers.

14. The connection device according to claim 13, wherein said sequence of layers includes:
   a first layer having Ag(Sn);
   a second layer having $Ag_5Sn$ ($\zeta$); and
   a third layer having $Ag_3Sn(\epsilon)$.

15. The connection device according to claim 14, wherein said first layer is at least one of in contact with and at least partly integral with said buffer region.

16. The connection device according to claim 14, wherein said third layer is at least one of in contact with and at least partially integral with said connection region.

17. The connection device according to claim 1, wherein said intermediate region has a sequence of films.

18. The connection device according to claim 17, wherein said sequence of films includes:
   a first layer having Ag(Sn);
   a second layer having $Ag_5Sn$ ($\zeta$); and
   a third layer having $Ag_3Sn(\epsilon)$.

19. The connection device according to claim 18, wherein said first layer is at least one of in contact with and at least partly integral with said buffer region.

20. The connection device according to claim 18, wherein said third layer is at least one of in contact with and at least partially integral with said connection region.

21. The connection device according to claim 1, wherein said buffer region contains silver.

22. The connection device according to claim 1, wherein said buffer region is of silver.

23. The connection device according to claim 1, wherein said intermediate region contains a silver-tin alloy.

24. The connection device according to claim 1, wherein said intermediate region is a silver-tin alloy region.

25. The connection device according to claim 1, wherein said connection region has an intermetallic substrate of at least one of tin, silver, a metal, and a metal material.

26. The connection device according to claim 1, wherein said connection region is an intermetallic substrate of at least one of tin, silver, a metal, and a metal material.

27. The connection device according to claim 1, wherein the circuitry device is a semiconductor module.

28. The connection device according to claim 1, wherein the circuitry unit is a chip.

29. A method for producing a circuitry connection device, which comprises:
  at least one of mechanically and electrically connecting at least one circuitry unit of a circuitry device with at least one contact device to thermo-mechanically uncouple the circuitry unit and the contact device by:
    providing a metal/alloy portion between respective predetermined surface portions of the circuitry unit and the contact device, the metal/alloy portion having:
      a first section including silver and facing the surface portion of the circuitry unit;
      a second section including a silver-tin alloy and facing the surface portion of the contact device; and
      said first and second sections facing each other;
    heating at least one of:
      the metal/alloy portion; and
      at least parts of the first and second surface portions,
    above a eutectic melting temperature of the silver-tin alloy to form:
      a buffer region including silver;
      an intermediate region with a silver-tin alloy region; and
      a connecting region at the contact device including an intermetallic substrate of at least one of:
        tin;
        silver;
        a metal able to form an intermetallic compound with at least one of tin and silver; and
        a metal material able to form an intermetallic compound with at least one of tin and silver.

30. The method according to claim 29, wherein the metal is selected from the group consisting of Cu, Ag, Ni, NiP, Au, NiPd, Fe, Pd, Pt, Ti, and V.

31. The method according to claim 29, wherein the metal material is selected from the group consisting of Cu, Ag, Ni, NiP, Au, NiPd, Fe, Pd, Pt, Ti, and V.

32. The method according to claim 29, wherein the intermetallic substrate is an intermetallic tin-substrate.

33. The method according to claim 29, wherein the metal/alloy portion has a greater amount of silver than tin in the silver-tin alloy.

34. The method according to claim 29, wherein the second section has a greater amount of silver than tin in the silver-tin alloy.

35. The method according to claim 29, wherein the first section has a thickness approximately between 5 and 20 $\mu$m.

36. The method according to claim 29, wherein the second section has a thickness approximately between 2 and 10 $\mu$m.

37. The method according to claim 29, which further comprises carrying out the heating step by soldering.

38. The method according to claim 29, wherein the circuitry device is a semiconductor module.

39. The method according to claim 29, wherein the circuitry unit is a chip.

* * * * *